US011107532B2

(12) United States Patent
Lee

(10) Patent No.: US 11,107,532 B2
(45) Date of Patent: Aug. 31, 2021

(54) MEMORY DEVICE AND METHOD OF OPERATING MEMORY DEVICE

(71) Applicant: SK hynix Inc., Icheon-si Gyeonggi-do (KR)

(72) Inventor: Sang Heon Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/707,300

(22) Filed: Dec. 9, 2019

(65) Prior Publication Data
US 2020/0411099 A1 Dec. 31, 2020

(30) Foreign Application Priority Data
Jun. 25, 2019 (KR) .................. 10-2019-0075458

(51) Int. Cl.
| G11C 16/08 | (2006.01) |
| G11C 16/26 | (2006.01) |
| G11C 11/4074 | (2006.01) |
| G11C 16/16 | (2006.01) |
| G11C 16/34 | (2006.01) |
| G11C 16/12 | (2006.01) |

(52) U.S. Cl.
CPC .......... *G11C 16/08* (2013.01); *G11C 11/4074* (2013.01); *G11C 16/12* (2013.01); *G11C 16/16* (2013.01); *G11C 16/26* (2013.01); *G11C 16/3436* (2013.01)

(58) Field of Classification Search
CPC ..... G11C 16/08; G11C 16/26; G11C 11/4074; G11C 16/16; G11C 16/3436; G11C 16/12

USPC ..................................................... 365/185.13
See application file for complete search history.

(56) References Cited

U.S. PATENT DOCUMENTS

| 9,286,987 | B1 * | 3/2016 | Dong ................. G11C 16/0483 |
| 9,588,702 | B2 * | 3/2017 | Mittelholzer ......... G06F 3/0619 |
| RE47,017 | E * | 8/2018 | Nakano ................. G11C 16/30 |
| 10,224,109 | B2 * | 3/2019 | Kim ..................... G11C 16/107 |
| 10,665,303 | B1 * | 5/2020 | Lee .......................... G06F 3/061 |
| 2011/0255336 | A1 * | 10/2011 | Futatsuyama ...... G11C 16/3436 365/185.03 |
| 2015/0060992 | A1 * | 3/2015 | Taekyung ......... H01L 27/11582 257/324 |
| 2018/0366474 | A1 * | 12/2018 | Kim .................... H01L 27/1157 |

FOREIGN PATENT DOCUMENTS

| KR | 1020070111663 A | 11/2007 |
| KR | 101534274 B1 | 7/2015 |
| KR | 101617810 B1 | 5/2016 |

* cited by examiner

*Primary Examiner* — Fernando Hidalgo
(74) *Attorney, Agent, or Firm* — William Park & Associates Ltd.

(57) ABSTRACT

The present technology includes a memory device and a method of operating the memory device. The memory device includes a memory block including a plurality of memory cells connected to word lines, peripheral circuits configured to generate operation voltages to be applied to the word lines, and control logic configured to control the peripheral circuits in response to a program command, a read command, or an erase command. The peripheral circuits include a voltage generator that adjusts a section of threshold voltage distributions of memory cells to be programmed among the memory cells, according to a distance between the word lines.

14 Claims, 9 Drawing Sheets

MEMORY DEVICE AND METHOD OF OPERATING MEMORY DEVICE

CROSS-REFERENCE TO RELATED APPLICATION

The present application claims priority under 35 U.S.C. § 119(a) to Korean patent application number 10-2019-0075458, filed on Jun. 25, 2019, in the Korean Intellectual Property Office, the entire disclosure of which is incorporated herein by reference.

BACKGROUND

1. Technical Field

The present disclosure generally relates to a memory device, and more particularly to a memory device and a method of operation the memory device.

2. Related Art

A memory device may store data or output the stored data. For example, the memory device may be a volatile memory device in which stored data is lost when power supply is interrupted, or may be a non-volatile memory device in which stored data is maintained even though the power supply is interrupted. Such a memory device may include a memory cell array in which data is stored, peripheral circuits that performs various operations such as program, read, and erase, and control logic that controls peripheral circuits.

A memory controller may control data communication between a host and the memory device.

The memory device may communicate with the memory controller through a channel, and may perform a program, read, or erase operation according to a command received from the memory controller.

A memory device may be largely divided into a volatile memory device and a non-volatile memory device. The volatile memory device is a device in which stored data is lost when power supply is interrupted, and a non-volatile memory device is a device in which stored data is maintained even though power supply is interrupted. Since each of the volatile memory device and the non-volatile memory device have advantages and disadvantages, the volatile memory device and the non-volatile memory device may be used according to a purpose.

In the volatile memory device and the non-volatile memory device, the volatile memory device may be implemented as a 2D structure in which memory cells are arranged in parallel to a substrate, or a 3D structure in which memory cells are stacked in a vertical direction from a substrate.

In a case of the memory device of the 3D structure, since the memory cells are stacked in a vertical direction with respect to the substrate, word lines connected to the memory cells may also be stacked apart from each other. Therefore, during a program operation, interference between the memory cells stacked in the vertical direction may occur.

SUMMARY

A memory device according to an embodiment of the present disclosure may include a memory block including a plurality of memory cells connected to word lines, peripheral circuits configured to generate operation voltages to be applied to the word lines, and control logic configured to control the peripheral circuits in response to a program command, a read command, or an erase command. The peripheral circuits may include a voltage generator that adjusts a section of threshold voltage distributions of memory cells to be programmed among the memory cells, according to a distance between the word lines.

A memory device according to an embodiment of the present disclosure may include a memory block including a vertical channel film extending in a vertical direction on a substrate, and word lines stacked and spaced apart from each other along the vertical channel film, and a voltage generator configured to generate program voltages, pass voltages, and program verify voltages to be applied to the word lines, during a program operation. The voltage generator may adjust a level of the program verify voltages according to a distance between the word lines adjacent to each other.

A method of operating a memory device according to an embodiment of the present disclosure may include setting a program window including threshold voltage distributions of a program according to a distance between word lines, adjusting a verify voltage according to a section of the program window, and sequentially applying a program voltage and the verify voltage to selected word lines among the word lines to program selected memory cells.

DETAILED DESCRIPTION

The advantages and features of the present disclosure, and a method of accomplishing the advantages and features will be described through embodiments that are described below together with the accompanying drawings. However, the present disclosure is not limited to the embodiments described herein but may be embodied in other forms.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes an element, the case means that the portion may include other elements without excluding other elements unless specifically stated otherwise.

An embodiment of the present disclosure may provide a memory device and a method of operating the memory device capable of reducing interference between memory cells. Since the present technology may reduce interference that may occur between the memory cells during a program operation, reliability of the program operation of the memory device may be improved.

Figure 1:
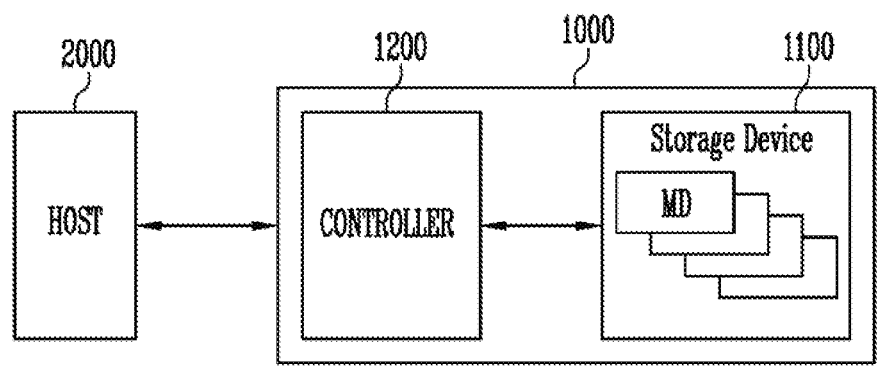
FIG. 1 is a diagram for describing a memory system according to an embodiment of the present disclosure.

FIG. 1 is a diagram for describing a memory system according to an embodiment of the present disclosure.

Referring to FIG. 1, a memory system 1000 may include a storage device 1100 in which data is stored and a controller 1200 that communicates between the storage device 1100 and a host 2000.

The storage device 1100 may include a plurality of memory devices MD. For example, the memory devices MD may be implemented as a volatile memory device in which stored data is lost when power supply is interrupted, or a non-volatile memory device in which stored data is maintained even though power supply is interrupted. In the following embodiments, memory devices MD implemented as a non-volatile memory device are shown as an embodiment. The non-volatile memory device may be a NAND flash memory device.

The memory devices MD may be connected to the controller 1200 through at least one channel. For example, a plurality of memory devices MD may be connected to one channel, and a plurality of memory devices MD may be connected to each channel even when a plurality of channels are connected to the controller 1200.

The controller 1200 may communicate between the host 2000 and the storage device 1100. The controller 1200 may control the storage device 1100 according to a request of the host 2000 or may perform a background operation for performance improvement of the memory system 1000 even though there is no request from the host 2000. The host 2000 may generate requests for various operations and output the generated requests to the memory system 1000. For example, the requests may include a program request that may control a program operation, a read request that may control a read operation, an erase request that may control an erase operation, and the like. The host 2000 may communicate with the memory system through various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 2:
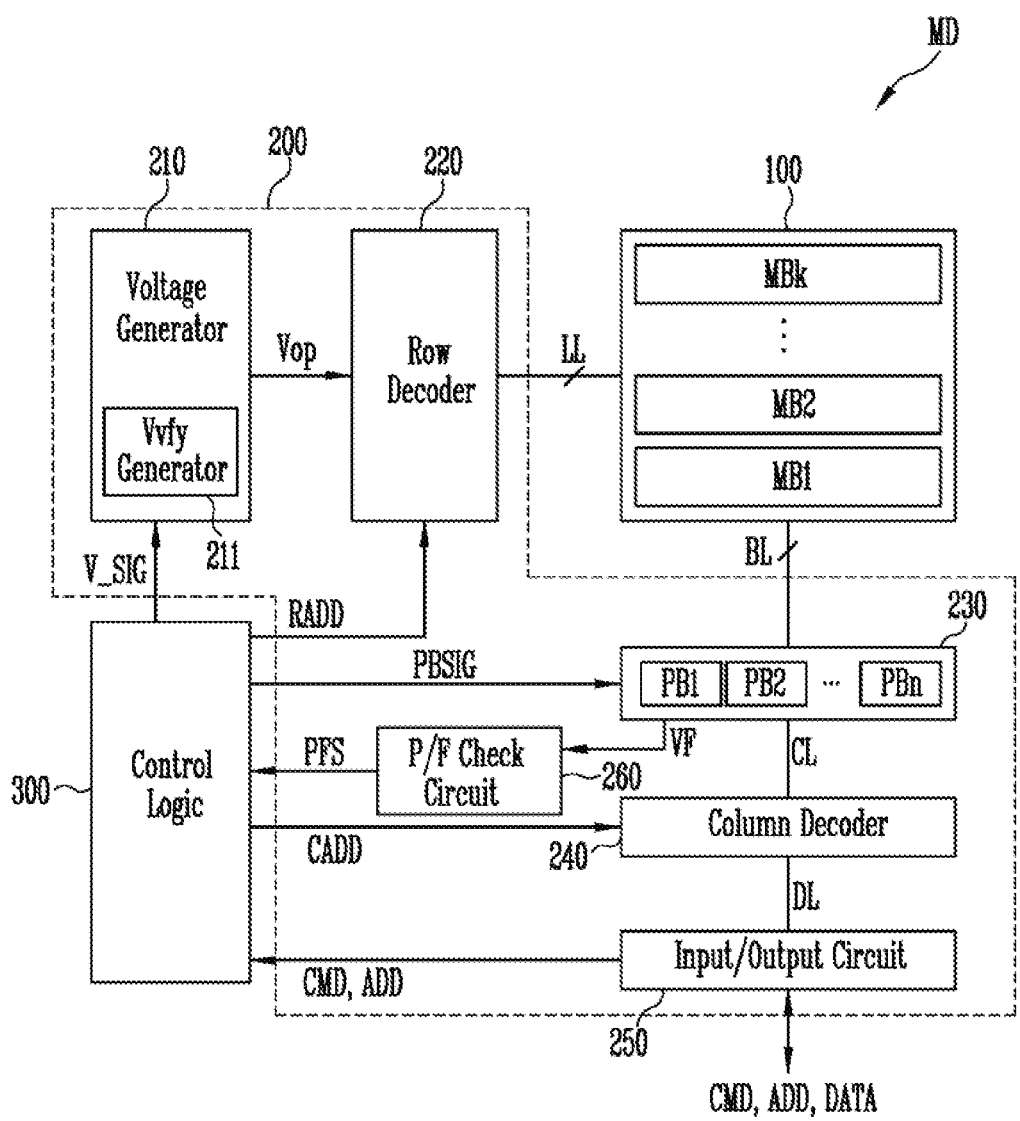
FIG. 2 is a diagram for describing a memory device according to an embodiment of the present disclosure.

FIG. 2 is a diagram for describing a memory device according to an embodiment of the present disclosure.

Referring to FIG. 2, the memory device MD may include a memory cell array 100 in which data is stored. The memory device MD may include peripheral circuits 200 configured to perform a program operation for storing data in the memory cell array 100, a read operation for outputting the stored data, and an erase operation for erasing the stored data. The memory device MD may include control logic 300 that controls the peripheral circuits 200 under control of the controller (1200 of FIG. 1). The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks MB1 to MBk (k is a positive integer). The memory blocks MB1 to MBk may be implemented in a two-dimensional or three-dimensional structure. For example, the memory blocks MB1 to MBk having a two-dimensional structure may include memory cells arranged in a horizontal direction on a substrate, and the memory blocks MB1 to MBk having a three-dimensional structure may include memory cells arranged in a vertical direction with respect to the substrate.

The peripheral circuits 200 may be configured to perform program, read, and erase operations in accordance with control of the control logic 300. For example, the peripheral circuits 200 may include a voltage generation circuit 210, a row decoder 220, a page buffer group 230, a column decoder 240, an input/output circuit 250, and a pass/fail check circuit 260.

The voltage generation circuit 210 may generate various operation voltages Vop used in the program, read, and erase operations in response to an operation signal V_SIG. For example, the operation voltages Vop may include a program voltage, a pass voltage, a read voltage, and an erase voltage. In addition, the operation voltages Vop may include various voltages that may be used in various operations. In addition, the voltage generation circuit 210 may include a verify voltage generator (Vvfy generator) 211 for generating a verify voltage Vvfy. In an embodiment, the verify voltage generator 211 may be implemented in hardware, software, or a combination thereof. For example, the Vvfy generator 211 may be realized as a Vvfy generator circuit operating in accordance with an algorithm.

The verify voltage generator 211 may generate the verify voltages Vvfy having various levels in response to the operation signal V_SIG. The verify voltages Vvfy may be used in a program verify operation performed during the program operation and may also be used in an erase verify operation performed during the erase operation. Therefore, the verify operations Vvfy may be set to various levels according to the program operation or the erase operation. For example, the verify voltages Vvfy may be set to various levels according to a single level cell (SLC), multi-level cell (MLC), triple level cell (TLC), or quadruple level cell (QLC) method. For example, a memory cell may have any one threshold value among threshold voltages of one erase state and one program in the SLC method, may have any one threshold value among threshold voltages of one erase state and three programs in the MLC method, may have any one threshold value among threshold voltages of one erase state and seven programs in the TLC method, and may have any one threshold value among threshold voltages of one erase state and fifteen programs in the QLC method. In addition, the memory cells may have various threshold voltages according to various programming methods.

Various verify voltages Vvfy may be set according to the number of threshold voltage distributions that the memory cells may have and a program window may be determined according to the set verify voltages Vvfy. The program window may be a section including all the threshold voltage distributions corresponding to the program. For example, a section between the lowest threshold voltage and the highest threshold voltage among the threshold voltage distributions corresponding to the program may be the program window. Therefore, the higher voltage levels of the program window, the higher voltage levels of the program voltages and the verify voltages Vvfy, and the lower voltage levels of the program window, the lower voltage levels of the program voltages and the verify voltages Vvfy.

The verify voltage generator 211 according to the present embodiment may generate the verify voltages Vvfy set according to a level of the program window. For example, the verify voltage generator 211 may generate the verify voltages Vvfy to be used for the program operation at a higher level as the level of the program window is higher and may generate the verify voltages Vvfy to be used for the program operation at a lower level as the level of the program window is lower.

For example, the row decoder 220 may transfer the operation voltages Vop to local lines LL connected to a selected memory block among the memory blocks of the memory cell array 100 in response to a row address RADD, according to a distance between the memory cells or a distance between the word lines connected to the memory cells. The local lines LL may include local word lines, local drain select lines, and local source select lines. In addition, the local lines LL may include various lines connected to the memory block, such as a source line.

The page buffer group 230 may be connected to bit lines BL connected to the memory blocks of the memory cell array 100. The page buffer group 230 may include a plurality of page buffers PB1 to PBn connected to the bit lines BL. The page buffers PB1 to PBn may operate in response to page buffer control signals PBSIG. For example, the page buffers PB1 to PBn may temporarily store data received through the bit lines BL, or may sense a voltage or a current of the bit lines BL during the read or verify operation.

The column decoder 240 may transfer data between the input/output circuit 250 and the page buffer group 230 in response to a column address CADD. For example, the column decoder 240 may exchange data with the page buffers PB1 to PBn through the column lines CL, and exchange data with the input/output circuit 250 through the data lines DL.

The input/output circuit 250 may receive a command CMD, an address ADD, and data DATA from the controller (1200 of FIG. 1), transfer the command CMD and the address ADD to the control logic 300, and transmit the data to the column decoder 240. In addition, the input/output circuit 250 may output the data DATA received from the column decoder 240 to the controller 1200.

The pass/fail check circuit 260 may compare the number of fail bits included in the data sensed during the verify operation with the number of set allowable bits and output a pass/fail signal PFS as a comparison result. For example, when the number of the fail bits of a verify value VF output from the page buffer group 230 is greater than the number of the allowable bits, the pass/fail check circuit 260 may output the pass/fail signal PFS corresponding to fail, and when the number of the fail bits is less than the number of the allowable bits, the pass/fail check circuit 260 may output the pass/fail signal PFS corresponding to pass.

The control logic 300 may output the operation signal V_SIG, the row address RADD, the page buffer control signals PBSIG, and the column address CADD in response to the command CMD and the address ADD to control the peripheral circuits 200. In addition, the control logic 300 may determine whether or not the program operation is completed according to the pass/fail signal PFS.

Figure 3:
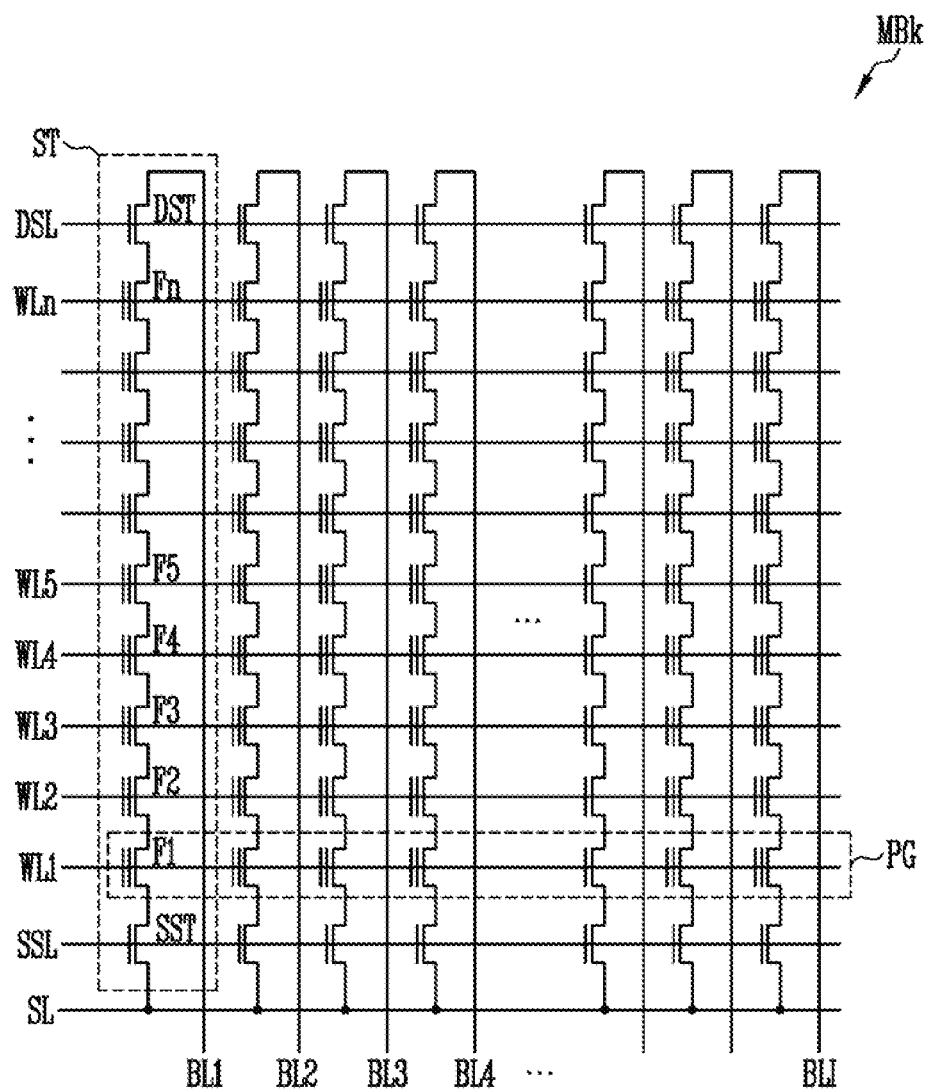
FIG. 3 is a circuit diagram for describing a memory block of FIG. 2.

FIG. 3 is a circuit diagram for describing the memory block of FIG. 2.

Referring to FIG. 3, the memory block MBk may include a plurality of cell strings ST connected between bit lines BL1 to BLI and a source line SL. For example, the strings ST may be connected to the bit lines BL1 to BLI, respectively, and may be commonly connected to the source line SL. Since the strings ST are configured similarly to each other, a string ST connected to the first bit line BL1 will be described as an example as follows.

The string ST may include a source select transistor SST, first to n-th memory cells F1 to Fn (n is a positive integer), and a drain select transistor DST connected in series between the source line SL and the first bit line BL1. The number of source and drain select transistors SST and DST is not limited to the number shown in FIG. 5. The source select transistor SST may be connected between the source line SL and the first memory cell F1. The first to n-th memory cells F1 to Fn may be connected in series between the source select transistor SST and the drain select transistor DST. The drain select transistor DST may be connected between the n-th memory cell Fn and the first bit line BL1. Although not shown in the drawing, dummy cells may be further connected between the memory cells F1 to Fn or between the source select transistor SST and the drain select transistor DST.

Gates of the source select transistors SST included in the different strings ST may be connected to a source select line SSL, gates of the first to n-th memory cells F1 to Fn may be connected to first to n-th word lines WL1 to WLn, and gates of the drain select transistors DST may be connected to drain select lines DSL. Here, a group of memory cells connected to the word lines WL1 to WLn, respectively, is referred to as a page PG. For example, a group of the first memory cells F1 connected to the first word line WL1 among the memory cells F1 to Fn included in the different strings ST may be one page PG. The program and read operations may be performed in a page PG unit.

Figure 4:
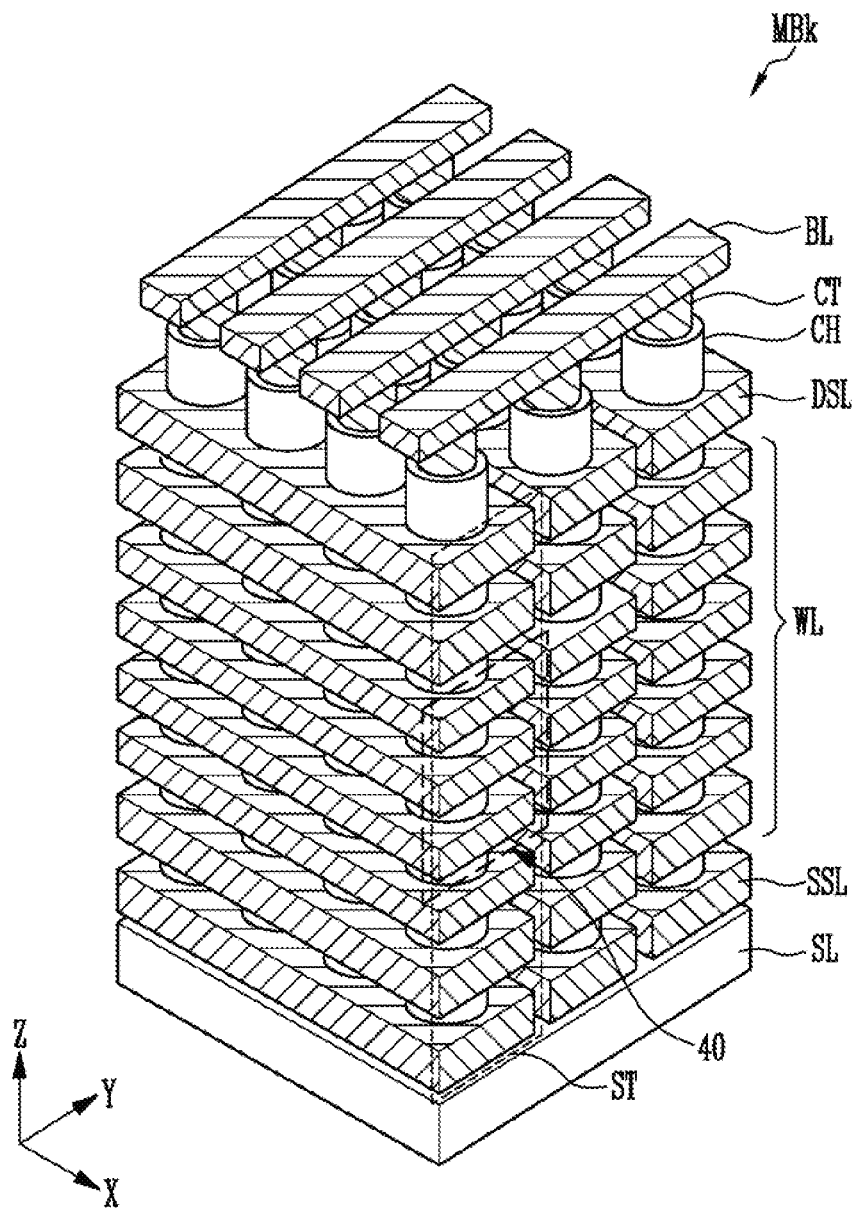
FIG. 4 is a perspective view for describing the memory block of FIG. 2.

FIG. 4 is a perspective view for describing the memory block of FIG. 2.

Referring to FIG. 4, in a memory block MBk formed in a three-dimensional structure, the strings may be formed in a vertical (Z direction) I shape on a substrate, and may be formed between the bit lines BL and the source line SL. Alternatively, a well may be formed instead of the source line SL. Such a structure is also referred to as bit cost scalable (BiCS). For example, when the source line SL is horizontally formed on the substrate, the strings ST having the BiCS structure may extend in the vertical direction (Z direction) on the source line SL.

For example, the strings ST may be arranged in each of a first direction (X direction) and a second direction (Y direction) and may extend in a third direction (Z direction). The strings ST may include the source select lines SSL, the word lines WL, and the drain select lines DSL that are stacked and spaced apart from each other. The number of the source select lines SSL, word lines WL, and drain select lines DSL is not limited to the number shown in the drawings, and may vary depending on the memory device MD. The strings ST may include a vertical channel film CH vertically penetrating the source select lines SSL, the word lines WL, and the drain select lines DSL, and the bit lines BL which are in contact with an upper portion of the vertical channel film CH protruded to an upper portion of the drain select lines DSL and extend in the second direction (Y direction). The memory cells may be formed between the word lines WL and the vertical channel films CH. A contact plug CT may be further formed between the bit lines BL and the vertical channel films CH.

In the memory block MBk formed in a three-dimensional structure, the string may be formed not only in the I shape shown in FIG. 4 but also in a U shape (not shown) in which the vertical channel films CH are connected to each other through a pipe transistor. In an embodiment, the vertical channel films CH may extend in a first direction X which is substantially perpendicular to the source line SL and the substrate.

In the memory block MBk formed in the three-dimensional structure, since the memory cells are stacked in the third direction (Z direction) along the vertical channel films CH, in order to increase a degree of integration of the memory device MD, a distance between the memory cells is required to be reduced. In the memory block MBk formed in the three-dimensional structure, since the memory cells may be formed in the vertical channel films CH with which the word lines WL are in contact, as the distance between the word lines WL spaced apart from each other is reduced, the degree of integration of the memory device MD may be increased. However, when the distance between the word lines WL becomes narrower, the distance between the memory cells is also narrower at the same time, and thus interference may occur between the memory cells during the program operation. In this regard, a partial region 40 of the memory block MBk will be described as an example as follows.

Figure 5:
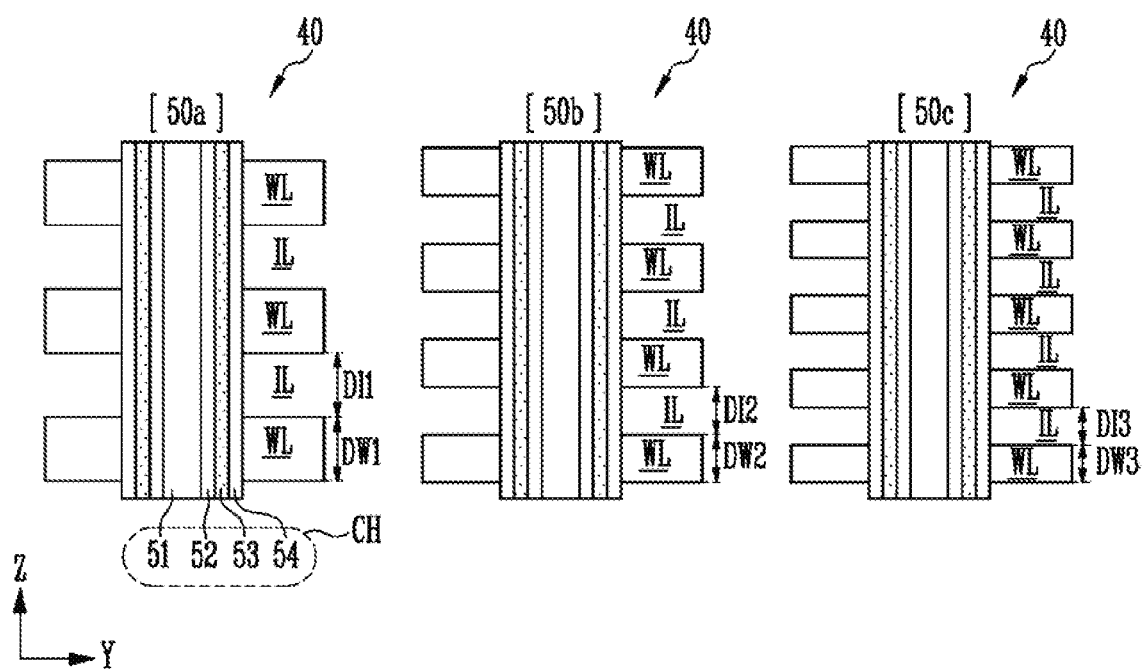
FIG. 5 is a diagram for describing a distance between word lines.

FIG. 5 is a diagram for describing the distance between the word lines.

Referring to FIG. 5, the word lines WL may be stacked apart from each other along the vertical channel film CH, and interlayer insulating films IL may be formed between the word lines WL. The word lines WL may be formed of a conductive material, and the interlayer insulating films IL may be formed of an insulating material. The vertical channel film CH may include a channel film 51, a tunnel insulating film 52, a trap film 53, and a blocking film 54. For example, the channel film 51 may be formed in a cylindrical shape extending in the third direction (Z direction), and the tunnel insulating film 52, the trap film 53, and the blocking film 54 may be sequentially formed to surround the channel film 51. Although not shown in the drawing, a pillar formed of an insulating material may be further formed at a center of the channel film 51. Therefore, the word lines WL may be stacked apart from each other in the third direction (Z direction) along the blocking film 54.

In FIG. 5, '50a' is a cross-sectional view in which the word lines WL have a first thickness DW1 and the distance between the word lines WL is a first distance DI1, '50b' is a cross-sectional view in which the word lines WL have a second thickness DW2 thinner than the first thickness DW1 and the distance between the word lines WL is a second distance DI2 narrower than the first distance DI1, and '50c' is a cross-sectional view in which the word lines WL has a third thickness DW3 thinner than the second thickness DW2 and the distance between the word lines WL is a third distance DI3 narrower than the second distance DI2. In an embodiment, the first distance DI1 may be a distance between two adjacent word lines in the third direction, as illustrated in FIG. 5. In an embodiment, the second distance DI2 may be a distance between two adjacent word lines in the third direction as illustrated in FIG. 5. In an embodiment, the third distance DI3 may be a distance between two adjacent word lines in the third direction as illustrated in FIG. 5.

As described above, in a case of the memory blocks in which the thicknesses and distances of the word lines WL are different from each other, the interference between the memory cells may increase as the distance between the word lines WL is narrow. Although FIG. 5 shows the cross-section 40 of the memory blocks in which the thicknesses of the word lines WL are different from each other, the interference between the memory cells may be more influenced by the distance than the thickness of the word lines WL. For example, even though the thicknesses of the word lines WL are equal to each other, the interference between the memory cells may increase when the distance of the word lines WL becomes narrow.

Therefore, in order to reduce the interference between the memory cells, the program window may be adjusted according to the distance between the word lines WL and the thickness of the word lines WL.

Figure 6:
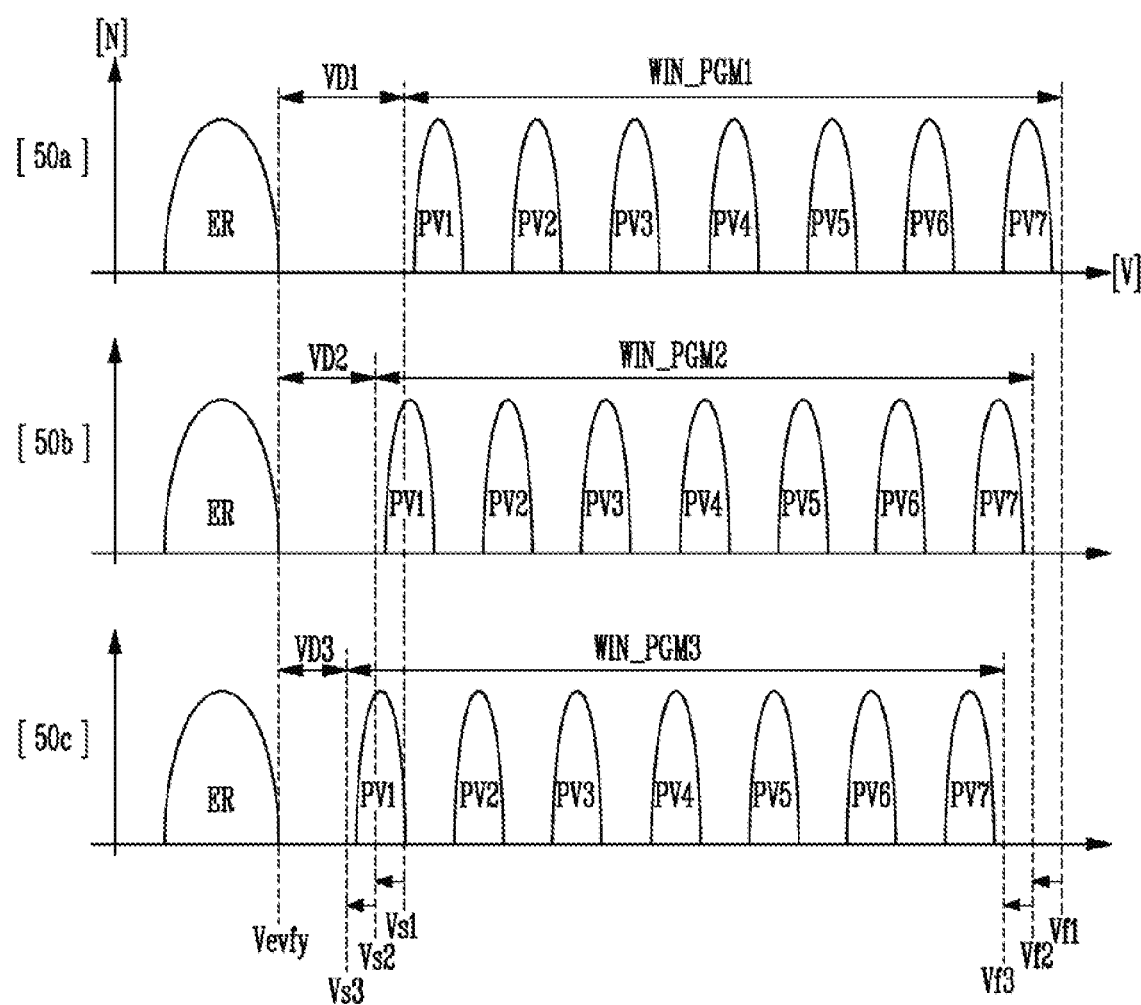
FIG. 6 is a diagram for describing a method of setting a program window according to an embodiment of the present disclosure.

FIG. 6 is a diagram for describing a method of setting a program window according to an embodiment of the present disclosure.

Referring to FIGS. 5 and 6, for example, memory cells programmed by the TLC method will be described. The memory cells may have any one threshold voltage distribution among an erase state ER and first to seventh program states PV1 to PV7. Among these, threshold voltages corresponding to the first to seventh program states PV1 to PV7 may be distributed in the program window.

When the distance between the word lines WL has a first distance DL1 as shown in 50a, the threshold voltages of the first to seventh program states PV1 to PV7 may be distributed in a first program window WIN_PGM1 between a first start voltage Vs1 and a first end voltage Vf1. That is, the threshold voltages of the first to seventh program states PV1 to PV7 may be changed in the first program window WIN_PGM1. Since an embodiment in which the distance between the word lines WL is the widest corresponds to 50a, among 50a, 50b, and 50c, the first program window WIN_PGM1 may be a program window having the highest level (i.e., highest level of start and end voltages) among 50a, 50b, and 50c.

In 50b, since the distance between the word lines WL is narrower than the distance between the word lines WL of 50a, the threshold voltages of the first to seventh program states PV1 to PV7 may be distributed in a second program window WIN_PGM2 having a level lower than the first program window WIN_PGM1 (i.e., the second program window WIN_PGM2 having start and end voltages lower than the first program window's WIN_PGM1 start and end voltages, respectively). That is, the threshold voltages of the first to seventh program states PV1 to PV7 may be changed in the second program window WIN_PGM2. For example, the second program window WIN_PGM2 may be set between a second start voltage Vs2 and a second end voltage Vf2. The second start voltage Vs2 may be lower than the first start voltage Vs1 and the second end voltage Vf2 may be lower than the first end voltage Vf1.

In 50c, since the distance between the word lines WL is narrower than the distance between the word lines WL of 50b, the threshold voltages of the first to seventh program states PV1 to PV7 may be distributed in a third program window WIN_PGM3 having a level lower than the second program window WIN_PGM2 (i.e., the third program window WIN_PGM3 having start and end voltages lower than the second program window's WIN_PGM2 start and end voltages, respectively). That is, the threshold voltages of the first to seventh program states PV1 to PV7 may be changed in the third program window WIN_PGM3. For example, the third program window WIN_PGM3 may be set between a third start voltage Vs3 and a third end voltage Vf3. The third start voltage Vs3 may be lower than the second start voltage Vs2 and the third end voltage Vf3 may be lower than the second end voltage Vf2. All of the first to third start voltages Vs1 to Vs3 may be set at a level higher than the erase verify voltage Vevfy.

Assuming that an erase threshold voltage is constant, when a voltage difference between the first program window WIN_PGM1 and the erase verify voltage Vevfy is a first voltage difference VD1, a voltage difference between the second program window WIN_PGM2 and the erase verify voltage Vevfy may have a second voltage difference VD2 less than the first voltage difference VD1, and a voltage difference between the third program window WIN_PGM3 and the erase verify voltage Vevfy may have a third voltage difference VD3 less than the second voltage difference VD2. In an embodiment, the voltage generator 210 may generate the erase verify voltage at a constant level regardless of the distance between the word lines WL.

That is, in an embodiment, when a level of the program window is set to be lower as the distance between the word lines WL becomes narrower, the interference between the memory cells may be reduced, and since a difference between the threshold voltage of the erase state and the threshold voltage of the program state is reduced, a program operation time may also be shortened.

Figure 7:
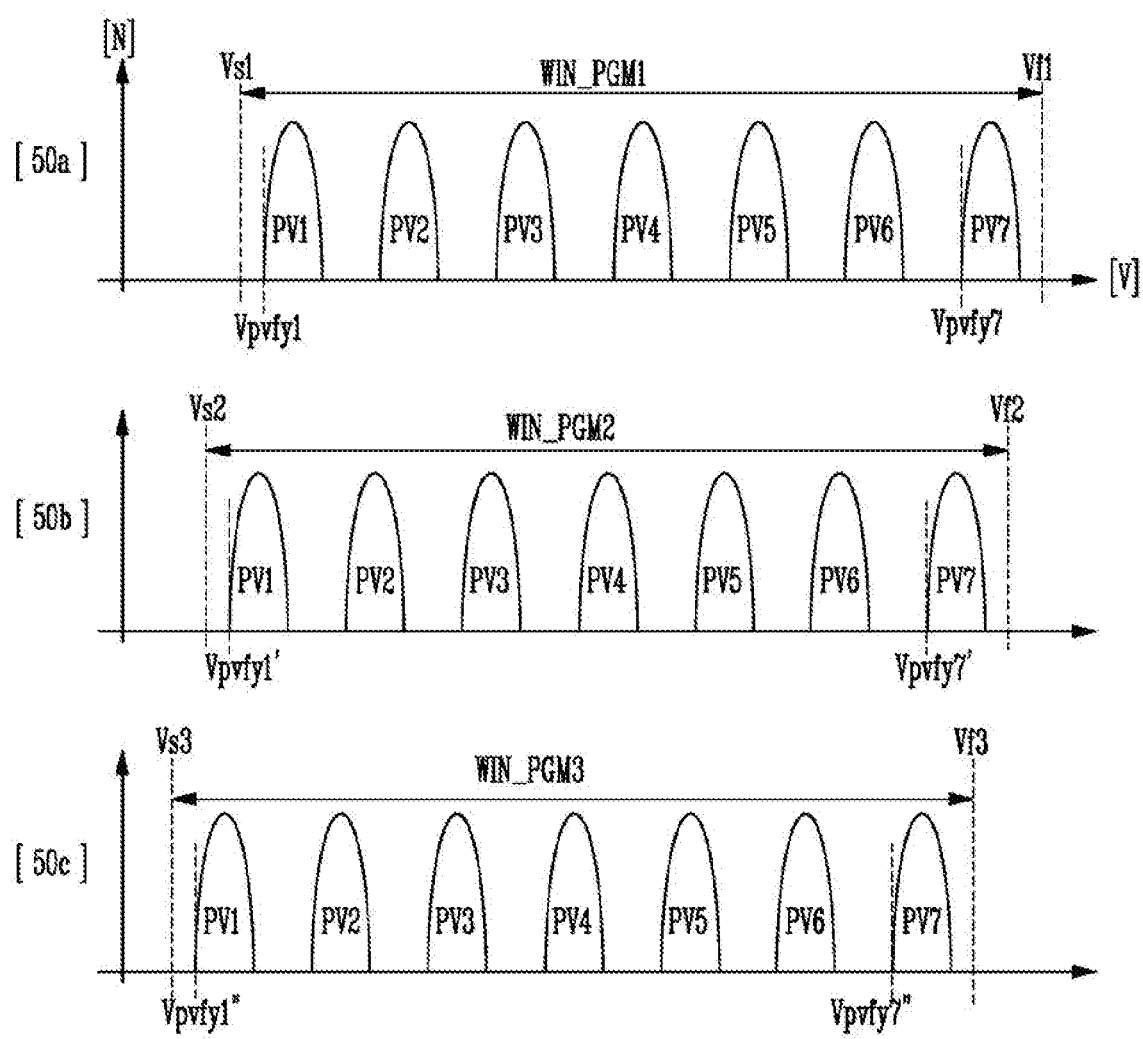
FIG. 7 is a diagram for describing an example of setting a program window.

FIG. 7 is a diagram for describing an example of setting a program window.

Referring to FIG. 7, the first to third program windows WIN_PGM1 to WIN_PGM3 may also be adjusted by changing a program verify voltage. For example, in FIG. 6, the first to third program windows WIN_PGM1 to WIN_PGM3 are set by the first to third start voltages Vs1 to Vs3 and the first to third end voltages Vf1 to Vf3. However, in FIG. 7, the first to third program windows WIN_PGM1 to WIN_PGM3 may also be set by verify voltages corresponding to the respective program states PV1 to PV7. For example, the first program window WIN_PGM1 may also be set by a first verify voltage Vpvfy1 corresponding to the lowest threshold voltage of the first program state PV1 and a seventh verify voltage Vpvfy7 corresponding to the lowest threshold voltage of the seventh program state PV7. For example, the first program window WIN_PGM1 may also be set by a first verify voltage Vpvfy1 corresponding to the lowest threshold voltage or the first program state PV1 and a seventh verify voltage Vpvfy7 corresponding to the highest threshold voltage or the seventh program state PV7.

In an embodiment, the second program window WIN_PGM2 may also be set by a first verify voltage Vpvfy1' corresponding to the lowest threshold voltage of the first program state PV1 and a seventh verify voltage Vpvfy7' corresponding to the lowest threshold voltage of the seventh program state PV7. In an embodiment, the second program window WIN_PGM2 may also be set by a first verify voltage Vpvfy1' corresponding to the lowest threshold voltage or the first program state PV1 and a seventh verify voltage Vpvfy7' corresponding to the highest threshold voltage or the seventh program state PV7. In an embodiment, the third program window WIN_PGM3 may be set by a first verify voltage Vpvfy1" corresponding to the lowest threshold voltage of the first program state PV1 and a seventh verify voltage Vpvfy7" corresponding to the lowest threshold voltage of the seventh program state PV7. In an embodiment, the third program window WIN_PGM3 may be set by a first verify voltage Vpvfy1" corresponding to the lowest threshold voltage or the first program state PV1 and a seventh verify voltage Vpvfy7" corresponding to the highest threshold voltage or the seventh program state PV7. The first verify voltage corresponding to Vpvfy1' may be set to be lower than the first verify voltage corresponding to Vpvfy1 and the first verify voltage corresponding to Vpvfy1" may be set to be lower than the first verify voltage corresponding to Vpvfy1'. In addition, the seventh verify voltage corresponding to Vpvfy7' may be set to be lower than the seventh verify voltage corresponding to Vpvfy7 and the seventh verify voltage corresponding to Vpvfy7" may be set to be lower than the seventh verify voltage corresponding to Vpvfy7'. Such verify voltages may be output according to the program window set in the verify voltage generator (211 of FIG. 2).

For example, when the verify voltage generator 211 is set to the first program window WIN_PGM1, the verify voltage generator 211 may generate the first to seventh verify voltages Vpvfy1 to Vpvfy7 during the program verify operation. When the verify voltage generator 211 is set to the second program window WIN_PGM2, the verify voltage generator 211 may generate the first to seventh verify voltages Vpvfy1' to Vpvfy7' during the program verify operation. When the verify voltage generator 211 is set to the third program window WIN_PGM3, the verify voltage generator 211 may generate the first to seventh verify voltages Vpvfy1" to Vpvfy7" during the program verify operation.

Figure 8:
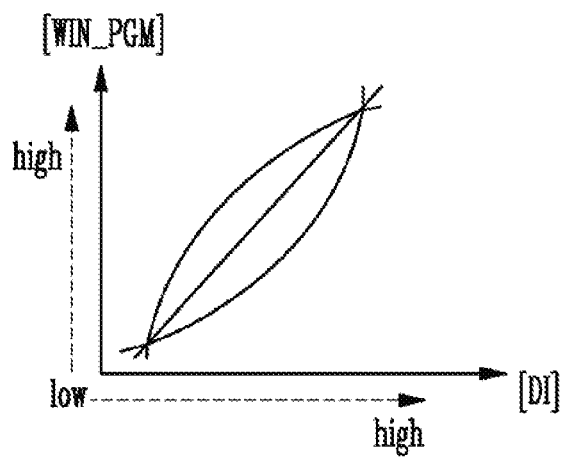
FIG. 8 is a graph for describing a relationship between the distance between the word lines and the program window.

FIG. 8 is a graph for describing a relationship between the distance between the word lines and the program window.

Referring to FIG. 8, the level of the program window WIN_PGM may be set in proportion to the distance DI between the word lines WL. That is, the verify voltage generator (211 of FIG. 2) may be set so that the level of the program window WIN_PGM also increases as the distance DI between the word lines WL increases (is high) and the level of the program window WIN_PGM is also reduced as the distance DI between the word lines WL is reduced (is low).

Figure 9:
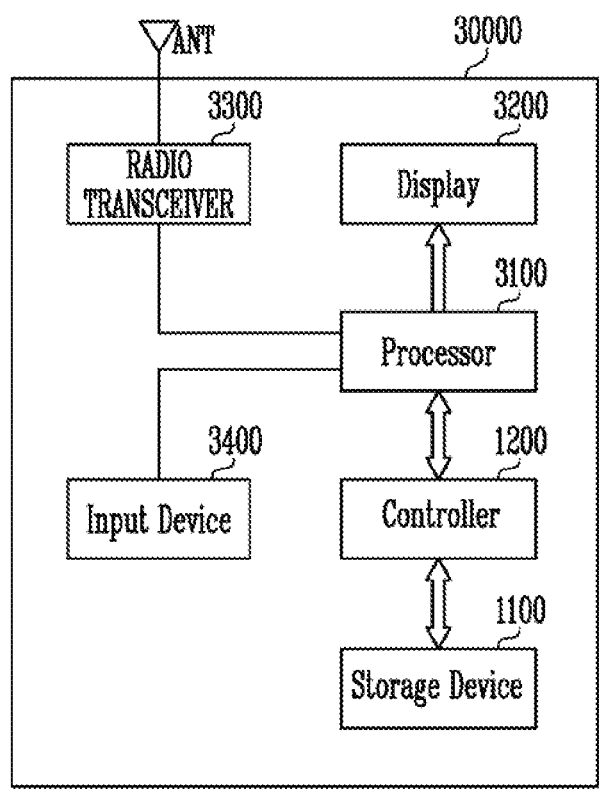
FIG. 9 is a diagram for describing another embodiment of a memory system including a storage device according to an embodiment of the present disclosure.

FIG. 9 is a diagram for describing another embodiment of the memory system including the storage device according to an embodiment of the present disclosure.

Referring to FIG. 9, a memory system 30000 may be implemented as a cellular phone, a smartphone, a tablet PC, a personal digital assistant (PDA) or a wireless communication device. The memory system 30000 may include the storage device 1100 and the controller 1200 capable of controlling the operation of the storage device 1100. The controller 1200 may control a data access operation, for example, a program operation, an erase operation, a read operation, or the like of the storage device 1100 under control of a processor 3100.

Data programmed in the storage device 1100 may be output through a display 3200 under the control of the controller 1200.

The storage device 1100 may include at least one memory device, and the memory device may generate the verify voltage in the program window set according to the distance between the word lines as the embodiments described above and may perform the program verify operation using the generated verify voltage.

A radio transceiver 3300 may transmit and receive radio signals through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may transmit the signal processed by the processor 3100 to the storage device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of storage device 1100 may be implemented as a part of the processor 3100 and may also be implemented as a chip separate from the processor 3100.

Figure 10:
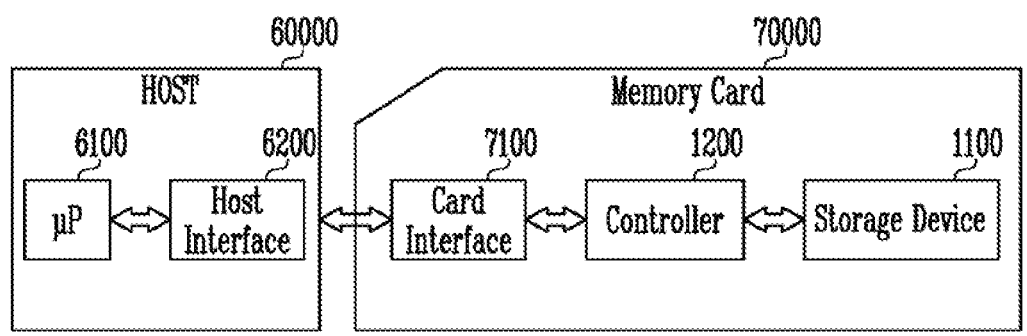
FIG. 10 is a diagram for describing another embodiment of a memory system including a storage device according to an embodiment of the present disclosure.

FIG. 10 is a diagram for describing another embodiment of the memory system including the storage device according to an embodiment of the present disclosure.

Referring to FIG. 10, a memory system 70000 may be implemented as a memory card or a smart card. The memory system 70000 may include the storage device 1100, the controller 1200, and a card interface 7100.

The storage device 1100 may include at least one memory device, and the memory device may generate the verify voltage in the program window set according to the distance between the word lines as the embodiments described above and may perform the program verify operation using the generated verify voltage.

The controller 1200 may control data exchange between the storage device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the storage device 1100 through the card interface 7100 and the controller 1200 under control of a microprocessor (μP) 6100.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A memory device comprising:
   a memory block including a plurality of memory cells connected to word lines;
   peripheral circuits configured to generate operation voltages to be applied to the word lines; and
   control logic configured to control the peripheral circuits in response to a program command, a read command, or an erase command,
   wherein the peripheral circuits include a voltage generator that is configured such that, when the word lines are separated by a first distance, a voltage difference between an erased state and a programmed state is a first voltage, and when the word lines are separated by a second distance that is smaller than the first distance, the voltage difference between the erased state and the programmed state is a second voltage that is smaller than the first voltage.

2. The memory device of claim 1, wherein the memory block comprises:
   a vertical channel film extending in a first direction perpendicular to a substrate; and
   the word lines are stacked and spaced apart from each other in the first direction along the vertical channel film.

3. The memory device of claim 2, wherein the distance between the word lines is a distance between word lines adjacent to each other in the first direction.

4. The memory device of claim 1, wherein the voltage generator generates program verify voltages having a higher level as the distance between the word lines is increased and generates program verify voltages having a lower level as the distance between the word lines is decreased.

5. The memory device of claim 1, wherein the voltage generator generates an erase verify voltage at a constant level regardless of the distance between the word lines.

6. The memory device of claim 1, wherein the voltage generator generates a program voltage and a pass voltage corresponding to the program command, a read voltage corresponding to the read command, and an erase voltage corresponding to the erase command.

7. The memory device of claim 6, wherein the voltage generator includes a verify voltage generator that generates program verify voltages corresponding to the program command.

8. A memory device comprising:
   a memory block including a vertical channel film extending in a vertical direction on a substrate, and word lines stacked and spaced apart from each other along the vertical channel film; and
   a voltage generator configured to generate program voltages, pass voltages, and program verify voltages to be applied to the word lines, during a program operation,
   wherein the voltage generator is additionally configured such that, when the word lines are separated by a first distance, a voltage difference between an erased state and a programmed state is a first voltage, and when the word lines are separated by a second distance that is smaller than the first distance, the voltage difference between the erased state and the programmed state is a second voltage that is smaller than the first voltage.

9. The memory device of claim 8, wherein a program window including threshold voltage distributions of memory cells is set according to the distance between the word lines, and
   the voltage generator adjusts the level of the program verify voltages according to the set program window.

10. The memory device of claim 9, wherein the voltage generator increases a start voltage and an end voltage of the program window as the distance between the word lines is increased and reduces the start voltage and the end voltage of the program window as the distance between the word lines is decreased.

11. The memory device of claim 8, wherein the voltage generator generates an erase verify voltage at a constant level regardless of the distance between the word lines.

12. A method of operating a memory device, the method comprising:

setting a program window including threshold voltage distributions of a program according to a distance between word lines such that, when the word lines are separated by a first distance, a voltage difference between an erased state and a programmed state is a first voltage, and when the word lines are separated by a second distance that is smaller than the first distance, the voltage difference between the erased state and the programmed state is a second voltage that is smaller than the first voltage.

13. The method of claim 12, wherein a start voltage and an end voltage of the program window are set according to the verify voltage.

14. The method of claim 13, wherein the start voltage and the end voltage of the program window are set to higher voltage levels when the distance between the word lines is wider and are set to lower voltages levels when the distance between the word lines is narrower.

* * * * *